United States Patent

Banno et al.

Patent Number: 5,320,910
Date of Patent: Jun. 14, 1994

[54] PIEZOELECTRIC COMPOSITE MATERIAL

[75] Inventors: Hisao Banno; Kohji Ogura, both of Nagoya, Japan

[73] Assignee: NGK Spark Plug Co., Ltd., Nagoya, Japan

[21] Appl. No.: 986,865

[22] Filed: Dec. 4, 1992

[30] Foreign Application Priority Data

Dec. 9, 1991 [JP] Japan ................. 3-350015
Dec. 9, 1991 [JP] Japan ................. 3-350016

[51] Int. Cl.$^5$ ................. C04B 35/49
[52] U.S. Cl. ................. 428/546; 428/551; 428/565; 252/62.9; 310/358; 501/134
[58] Field of Search ........... 428/546, 551, 565; 501/134, 23; 310/357, 358, 359, 360, 361, 362; 252/62.9; 29/25.35

[56] References Cited

U.S. PATENT DOCUMENTS

| | | | |
|---|---|---|---|
| 4,695,988 | 9/1987 | Banno | 367/154 |
| 4,874,727 | 10/1989 | Ohya et al. | 501/134 |
| 5,246,610 | 9/1993 | Banno et al. | 252/62.9 |
| 5,259,099 | 11/1993 | Banno et al. | 29/25.35 |

FOREIGN PATENT DOCUMENTS

| | | | |
|---|---|---|---|
| 63-223342 | 3/1990 | Japan . | |
| 2-337795 | 11/1990 | Japan . | |
| 1-288442 | 6/1991 | Japan . | |
| 3148884 | 6/1991 | Japan | 252/62.9 |

Primary Examiner—Peter A. Nelson
Assistant Examiner—Chrisman D. Carroll
Attorney, Agent, or Firm—Darby & Darby

[57] ABSTRACT

A piezoelectric composite material including an organic matrix, and 72-78 % by volume of a piezoelectric ceramic powder dispersed in the matrix and consisting of 25-41.6 % by weight of a first group of lead titanate particles having a first average particle size, 25-41.6 % by weight of a second group of lead titanate particles having a second average particle size and 25-41.6 % by weight of a third group of lead titanate particles having a third average particle size. The first, second and third average particle sizes are different from each other and generally 2.5-4.5 μm, 5-10 μm and 20-40 μm, respectively. At least a portion of the lead titanate particles of one of the first to third groups may be substituted with lead titanate zirconate having a similar particle size.

6 Claims, 12 Drawing Sheets

PIEZOELECTRIC COMPOSITE MATERIAL

BACKGROUND OF THE INVENTION

This invention relates generally to a piezoelectric composite material and, more specifically, to a flexible piezoelectric composite material containing a blend of piezoelectric ceramic powder homogeneously dispersed in an organic matrix and suitable for use in underwater acoustic transducers adapted to generate acoustic waves or supersonic waves or to receive such waves propagating in water.

Piezoelectric composite material containing piezoelectric ceramic powder, such as $PbTiO_3$ or $Pb(Ti,Zr)O_3$ powder, with an average particle size of several $\mu m$ homogeneously dispersed in an organic matrix such as a synthetic rubber is known. This composite material has a high piezoelectric constant and a good flexibility and shows good acoustic compatibility with water because of its low density and, hence, is suitable for utilization for underwater acoustic transducers.

The piezoelectric characteristics of such a piezoelectric composite material can be enhanced as the content of the piezoelectric ceramic powder in the matrix is increased. However, when the piezoelectric ceramic powder is used in a large amount, the amount of pores contained in the composite material is increased to the extent that the piezoelectric characteristics vary according to the hydrostatic pressure to which the composite material is subjected during use. To cope with this problem the present inventors have proposed the use of two kinds of ceramic particles with different average particle sizes (Japanese Patent Applications Nos. Sho 63-223342 and Hei 1-288442). Since small particles can fill the space between large particles, the amount of pores can be decreased so that the resulting composite exhibits less pressure dependency. However, the reduction of the pressure dependency and the piezoelectric characteristics of this composite material are still not fully satisfactory.

In hydrophones using a piezoelectric composite material of the above-mentioned type, the sensitivity is expressed as $d_h (=d_{33}+2d_{31})$. A piezoelectric composite material showing a large $d_h$ value has a high sensitivity. For the purpose of increasing the $d_h$ value, there have been proposed a method in which a piezoelectric ceramic having a large piezoelectric constant, such as $Pb(Ti,Zr)O_3$, is used, a method in which the amount of the piezoelectric ceramic is increased and a method in which the polarization voltage is increased. Up to present, however, piezoelectric composite material having sufficiently high sensitivity and low pressure dependency has not been provided yet.

In known piezoelectric composite materials, when the strain in one direction, for example, $d_{33}$ direction (in the direction parallel with the electrical field, is increased, the strain in the other direction, for example, $d_{31}$ direction (in the direction perpendicular to the electrical field) is also increased as a result of lateral-longitudinal coupling. Thus, in the case of a hydrophone which is to be connected to a hull and displaced therewith, noises attributed to the strain in the $d_{31}$ direction are unavoidably generated.

More particularly, a piezoelectric composite sheet obtained by impressing a direct current voltage of 70 kV/cm between opposing electrodes having disposed therebetween a sheet-like piezoelectric composite containing 60% by volume of $Pb(Ti,Zr)O_3$ powder dispersed in an epoxy resin matrix has $d_{33}$ and $d_{31}$ of $104 \times 10^{-12}$ C/N and $-45.5 \times 10^{-12}$ C/N, respectively. When such a composite sheet is used in air, the wave receiving sensitivity thereof is generally equal to $d_{33}$. On the other hand, when used in water, the composite sheet is subjected to hydrostatic pressure in all directions so that the sensitivity is $d_h$ which is $d_{33}+2d_{31}$ as described above, namely $13 \times 10^{-12}$ C/N. Thus, the sensitivity is reduced to about $\frac{1}{8}$ of $d_{33}$. Furthermore, when such a composite is used as a hydrophone, a noise signal is generated due to the strain in $d_{31}$ direction. This noise is added to the positive signal generated by the strain in the $d_{33}$ direction to lower the Signal-to-Noise ratio.

SUMMARY OF THE INVENTION

It is, therefore, an object of the present invention to provide a piezoelectric composite material suitable for utilization in underwater acoustic transducers such as hydrophones.

Another object of the present invention is to provide a piezoelectric composite material which shows a high $d_h$ and whose piezoelectric characteristics are pressure independent.

It is a further object of the present invention to provide a piezoelectric composite material showing an improved Signal-to-Noise ratio when used in hydrophones.

In accomplishing the foregoing objects, there is provided in accordance with the present invention a piezoelectric composite material which includes an organic matrix, and a piezoelectric ceramic powder dispersed in the matrix and consisting of 25-41.6% by weight of a first group of lead titanate particles having a first average particle size, 25-41.6% by weight of a second group of lead titanate particles having a second average particle size and 25-41.6% by weight of a third group of lead titanate particles having a third average particle size, the first, second and third average particle sizes being different from each other and the piezoelectric ceramic powder being present in an amount of 72-78% based on the total volume of the piezoelectric ceramic powder and the organic matrix.

In another aspect, the present invention provides a piezoelectric composite material comprising an organic matrix, and a piezoelectric ceramic powder dispersed in the matrix and consisting of 25-41.6% by weight of a first group of particles of lead titanate having a first average particle size, 25-41.6% by weight of a second group of particles of lead titanate zirconate or a mixture of lead titanate zirconate with lead titanate having a second average particle size and 25-41.6% by weight of a third group of particles of lead titanate having a third average particle size, the first, second and third average particle sizes being different from each other and the piezoelectric ceramic powder being present in an amount of 72-78% based on the total volume of the piezoelectric ceramic powder and the organic matrix, the composite material having been prepoled by application of a high voltage and thereafter subjected to reverse poling so that $d_{31}$ thereof is substantially zero.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

Piezoelectric composite material according to the present invention includes an organic matrix, and a piezoelectric ceramic powder dispersed in the organic matrix. Any conventionally employed organic matrix such as a synthetic resin or a synthetic rubber may be used for the purpose of the present invention.

In one preferred embodiment, the piezoelectric ceramic powder is composed of a first group of lead titanate particles (PT) having a first average particle size, a second group of lead titanate particles having a second average particle size and a third group of lead titanate particles having a third average particle size. The amount of each of the first through third groups of PT is 25-41.6% by weight based on the total weight of the first through third groups of PT. The first, second and third average particle sizes are different from each other and preferably 2.5-4.5 μm, 5-10 μm and 20-40 μm, respectively. The piezoelectric ceramic powder is present in an amount of 72-78% based on the total volume of the piezoelectric ceramic powder and the organic matrix. This piezoelectric composite material shows a high $d_h$ which hardly varies with hydrostatic pressure to which the composite material is subjected.

In another embodiment, the piezoelectric powder is composed of 25-41.6% by weight of a first group of PT having a first average particle size, 25-41.6% by weight of a second group of lead titanate zirconate (PZT) or a mixture of PZT with PT having a second average particle size and 25-41.6% by weight of a third group of particles of PT. The first, second and third average particle sizes are different from each other and the piezoelectric ceramic powder is present in an amount of 72-78% based on the total volume of the piezoelectric ceramic powder and the organic matrix. The piezoelectric composite material having the above construction is prepoled by application of a high voltage and thereafter subjected to reverse poling so that $d_{31}$ thereof is substantially zero.

The piezoelectric powder used in the above second embodiment is similar to that used in the first embodiment except that at least a portion of one of the first to third groups of PT of the piezoelectric powder of the first embodiment is substituted by PZT. Preferably, the first, second and third average particle sizes of the piezoelectric powder of the second embodiment are 2.5-4.5 μm, 5-10 μm and 20-40 μm, respectively.

Since PT has a large coercive force and high anisotropy in piezoelectric characteristics ($d_{33}/d_{31}$), the polarization thereof requires a direct current voltage of 50 kV/cm or more. On the other hand, PZT is small in coercive force and in anisotropy and is easily polarized at a direct current voltage of as low as 40 kV/cm. Therefore, when the piezoelectric composite containing both PT and PZT is applied with a high direct current voltage to polarize both PT and PZT and, thereafter, a low direct current voltage to polarize only PZT, the polarization directions of PT and PZT are opposite to each other. When $d_{31}$ of PT is made equal to that of PZT, the $d_{31}$ of the resulting composite is substantially zero. As a consequence, the piezoelectric composite material of the second embodiment has improved Signal-to-Noise ratio. Moreover, the composite gives a high $d_h$.

The composite material according to the present invention may be prepared in any known manner.

The following examples will further illustrate the present invention.

EXAMPLE 1

Figure 1:
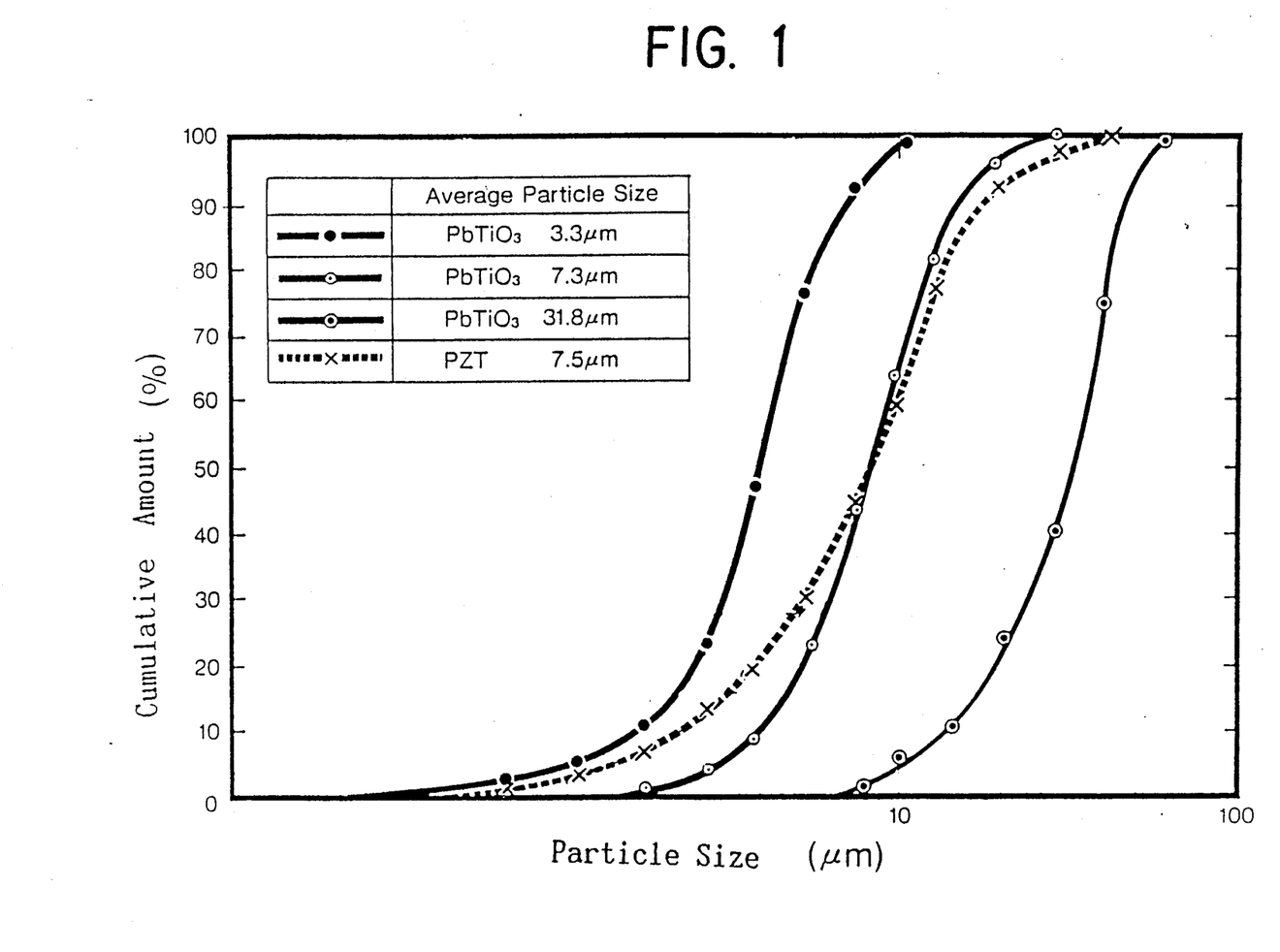
FIG. 1 is a graph showing the particle size distribution of piezoelectric ceramic particles used in Examples 1 and 2.

An equimolar mixture of PbO and TiO$_2$ was pressed in a mold at a pressure of 350 kg/cm$^2$ into tablets each having a diameter of 47 mm, a thickness of 5 mm and a density of 4.5 g/cm$^3$ and the tablets were heated at 1050° C. for 2 hours in an alumina crucible. The resulting high temperature mass was immersed in cool water for quenching to obtain lead titanate particles. These particles were further pulverized with a propeller type stirrer for 5 hours. The pulverized particles were filtered and dried at 100° C. for 24 hours and sieved to obtain first (X), second (Y) and third (Z) groups of piezoelectric ceramic particles having average particle sizes of 3.3 μm, 7.3 μm and 31.8 μm. The particle size distribution of each of the three groups X,Y and Z was as shown in FIG. 1.

Figure 2:
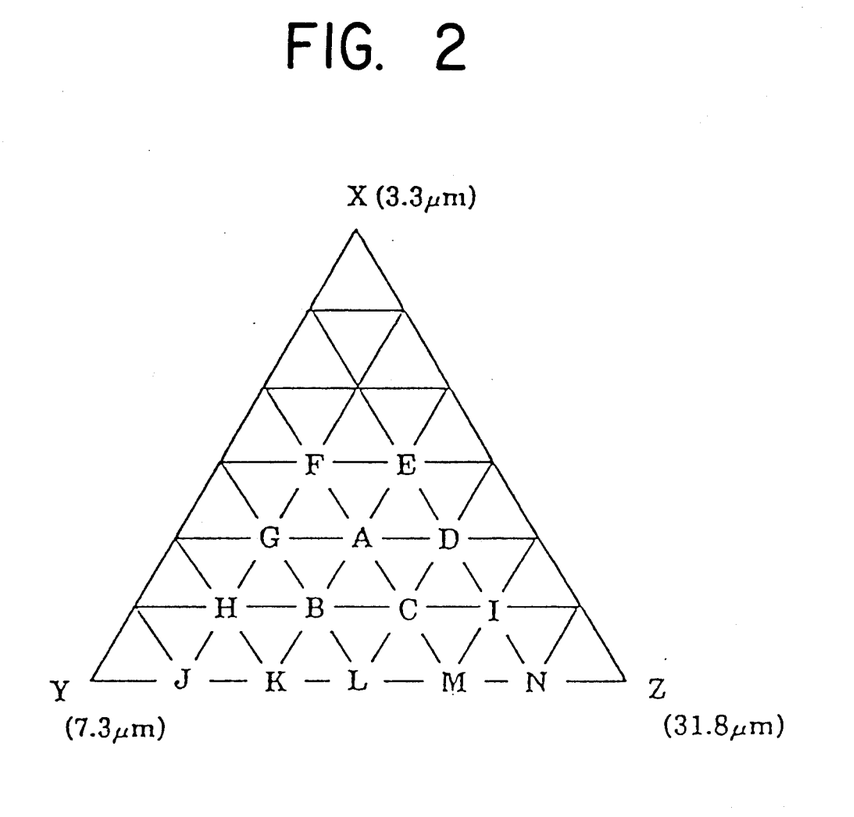
FIG. 2 is a triangular diagram showing the contents of three groups of piezoelectric ceramic particles X, Y and Z in respective piezoelectric powder blends A-N.
Figure 3A:
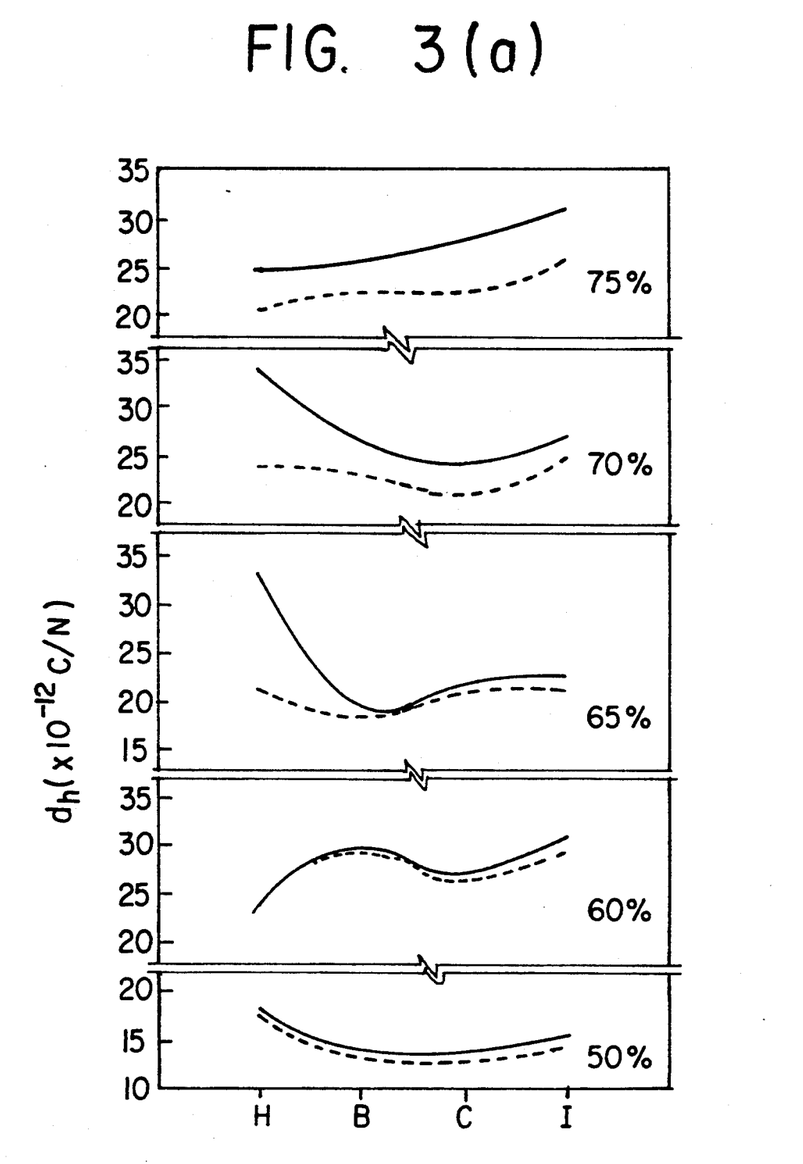
FIGS. 3(a) through 3(d) are graphs showing the relationship between piezoelectric constant $d_h$ and various contents of the ceramic powder blends A-N in respective piezoelectric composites.
Figure 3B:
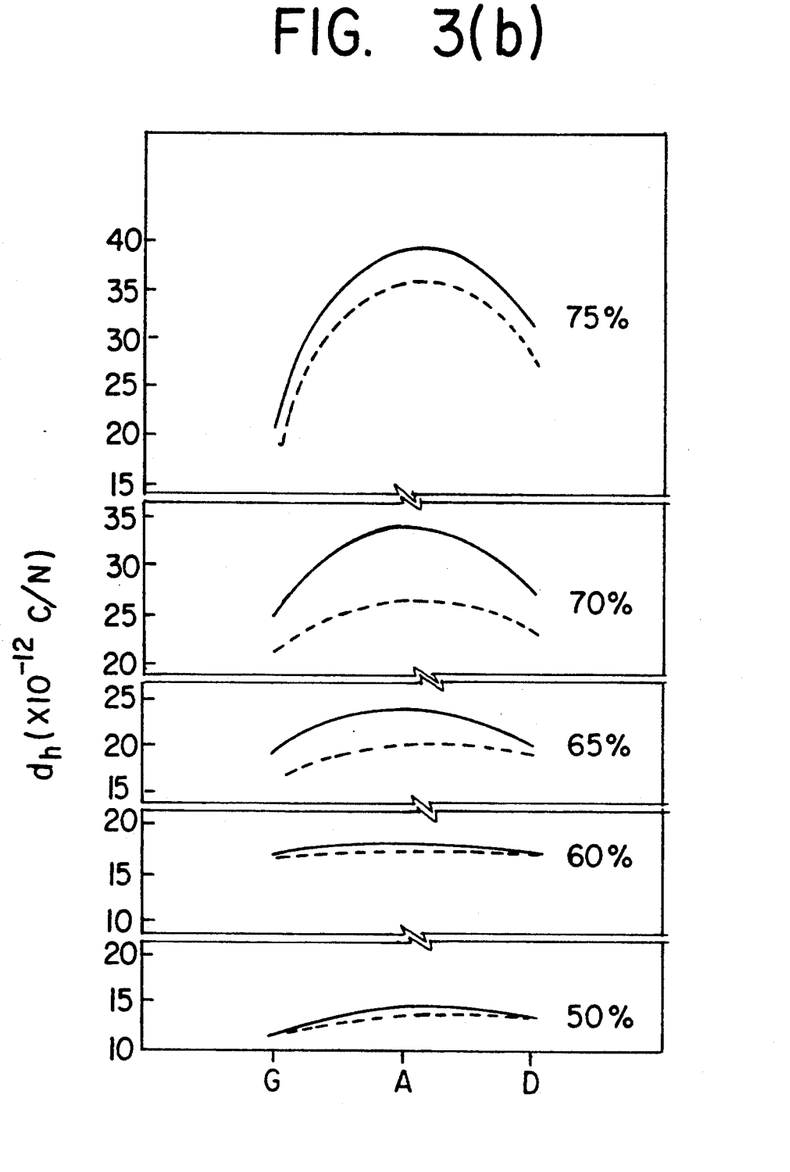
Figure 3C:
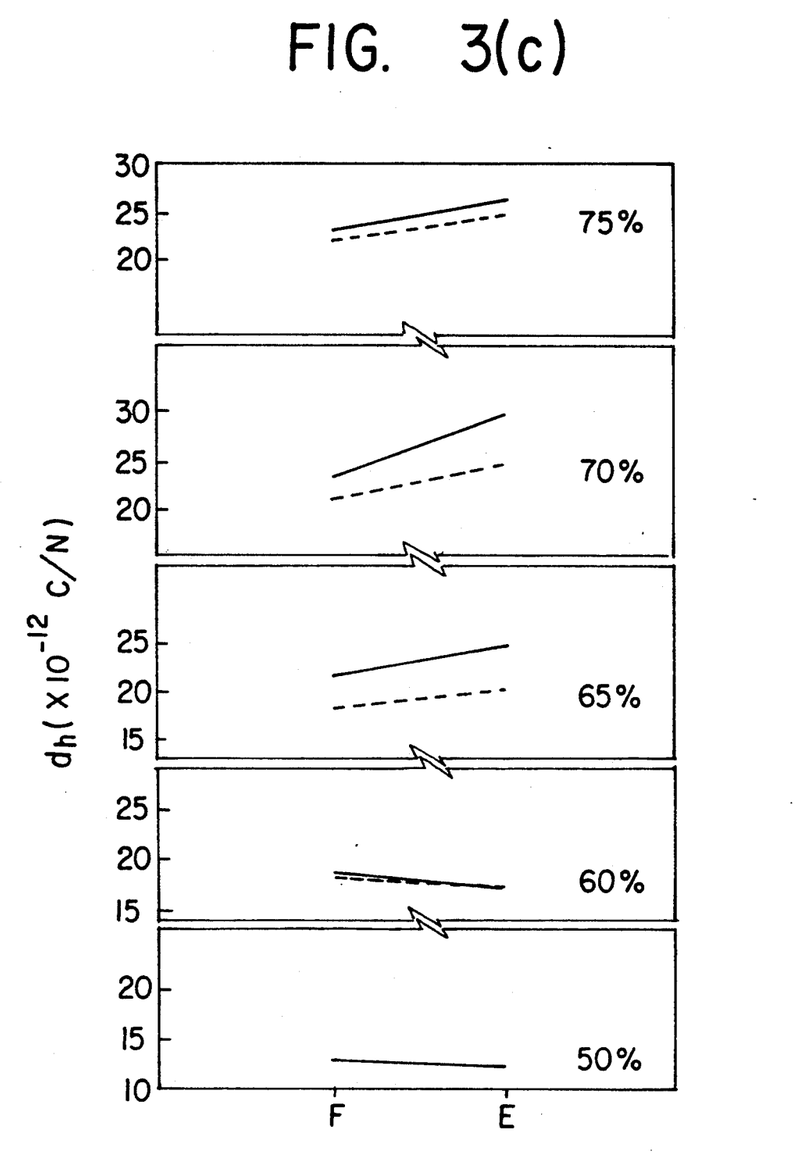
Figure 3D:
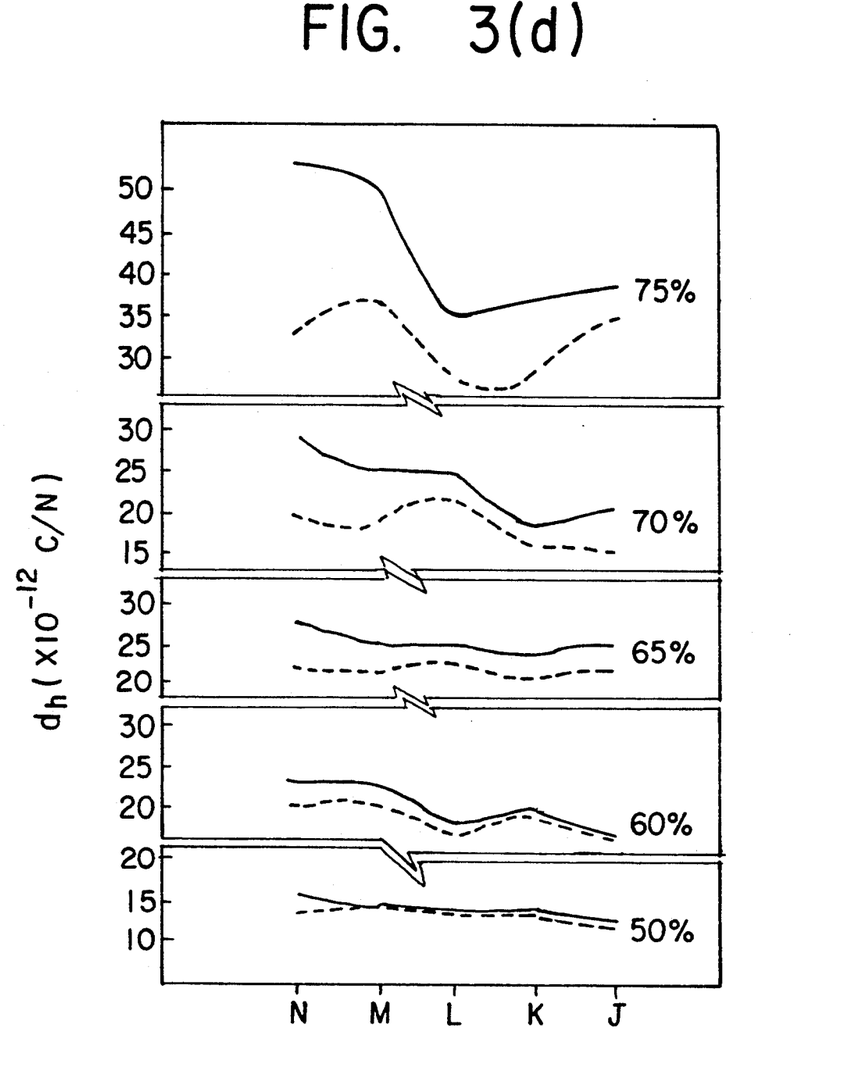

The three groups X, Y and Z of lead titanate particles were blended to obtain 14 kinds of piezoelectric powder blends A-N having weight ratios of X:Y:Z as shown in the triangular diagram of FIG. 2. In FIG. 2, one scale represents a proportion of 100/6% by weight. For example, the powder blends B and I have weight ratios of X:Y:Z of 1:3:2 and 1:1:4, respectively.

Each of the powder blends A-N was mixed with a synthetic rubber (chloroprene rubber) to obtain mixtures having various contents of the powder blend (50, 60, 65, 70 and 75% based on the total volume of the powder blend and the rubber). Into each of the mixtures was incorporated a vulcanizing agent in an amount of 25.5 parts by weight per 100 parts by weight of the rubber. The vulcanizing agent consisted of 20 parts by weight of $Pb_3O_4$, 5 parts by weight of ZnO and 0.5 part by weight of dibenzothiazyldisulfide. Each of the mixtures was roll-pressed and cured with a vulcanizing press machine at a temperature of 170° C. and a pressure of 140 kg/cm² for 15 minutes to obtain a sheet with a thickness of 1 mm. A silver paste was then applied onto both sides of each sheet to form electrodes. While keeping the sheet immersed in an electrically insulating liquid at 20° C., a direct current of 70 KV/cm was impressed between the electrodes for 1 hour for poling, thereby to obtain a piezoelectric composite rubber sheet. The thus obtained piezoelectric composites were then tested for their hydrostatic piezoelectric constant $d_h$ at hydrostatic pressures of 0.5 MPa and 15 MPa. The results are shown in FIGS. 3(a) through 3(d) by way of graphs showing the relationship between $d_h$ and the compositions of the ceramic powder blends A-N. In FIGS. 3(a)-3(d), the solid line illustrates the results at a hydrostatic pressure of 0.5 MPa while the dotted line shows the results at 15 MPa.

From the results summarized in FIGS. 3(a)-3(d), it will be appreciated that the piezoelectric composites having a piezoelectric ceramic powder content of 75% by volume show the highest piezoelectric constant $d_h$. Among the composites having ceramic powder blends A-I, the ceramic composite A-75 containing the piezoelectric powder blend A in an amount of 75% by volume shows the highest piezoelectric constant $d_h$ of $40 \times 10^{-12}$ C/N. The difference in $d_h$ of the composite A-75 between at 0.5 MPa and 15 MPa is $5 \times 10^{-12}$ C/N, indicating that the composite A-75 has an advantageously small pressure dependency with respect to the piezoelectric constant $d_h$.

Figure 4:
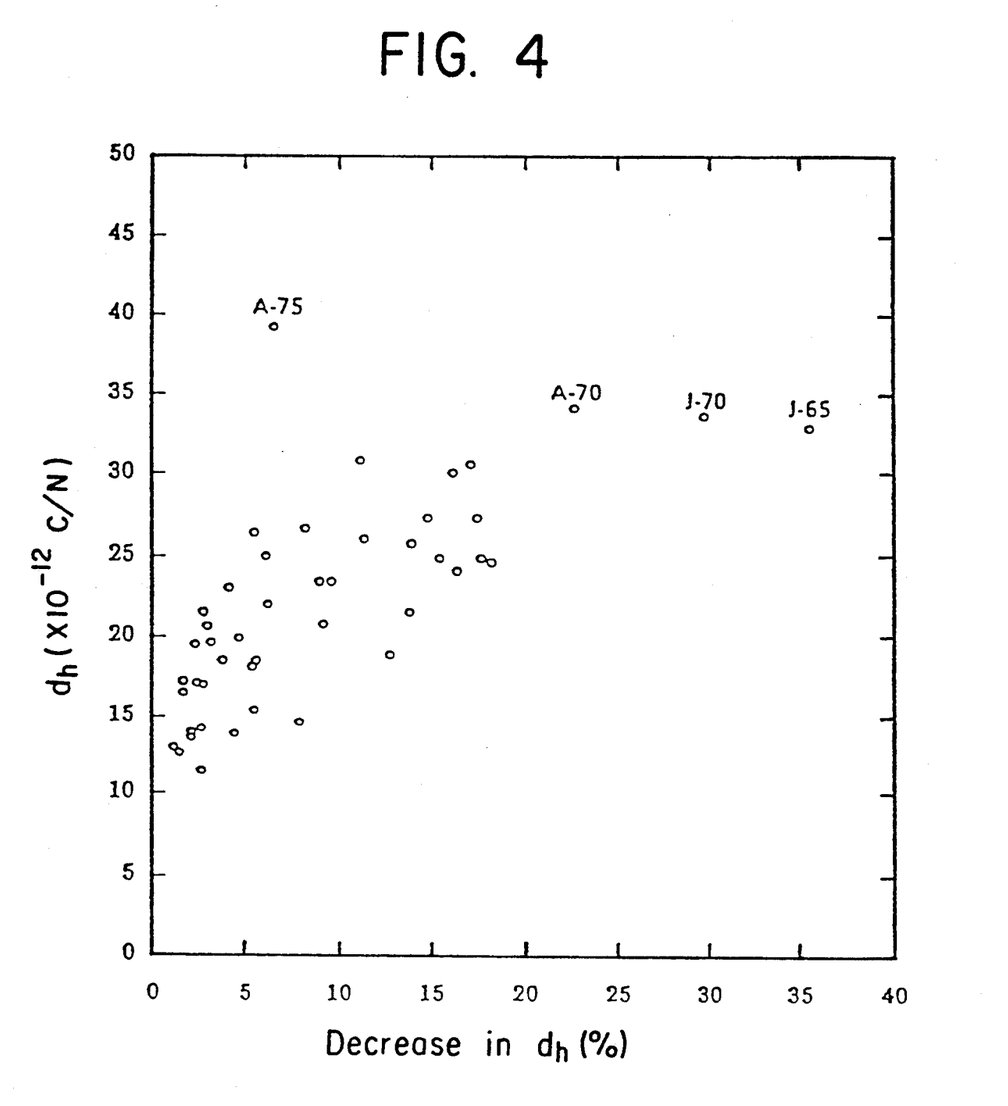
FIG. 4 is a graph showing the relationship between $d_h$ of respective piezoelectric composites and decrease in $d_h$ caused by change in hydrostatic pressure.

FIG. 4 illustrates a map showing the relationship between $d_h$ and decrease in $d_h$ as a result of the increase of hydrostatic pressure from 0.5 MPa to 15 MPa of various piezoelectric composites. The decrease in $d_h$ may be obtained from the results shown in FIGS. 3(a)-3(d). As shown in FIG. 4, the decrease in $d_h$ of the composites A-75, A-70, J-70 and J-65 are about 6, 24, 30 and 36%, respectively (in the symbol identifying the piezoelectric composites used herein, the character (such as "A") before the hyphen shows the kind of the piezoelectric powder blend contained in the composite and the numeral (such as "75" after the hyphen represents the content of the powder blend in the composite).

The composites J-75, K-75, L-75, M-75 and N-75 which do not contain ceramic particles (X) with an average particle size of 3.3 μm show high piezoelectric constants $d_h$. However, the difference in $d_h$ between at 0.5 MPa and at 15 MPa is great so that these composites have significant pressure dependency.

Figure 5:
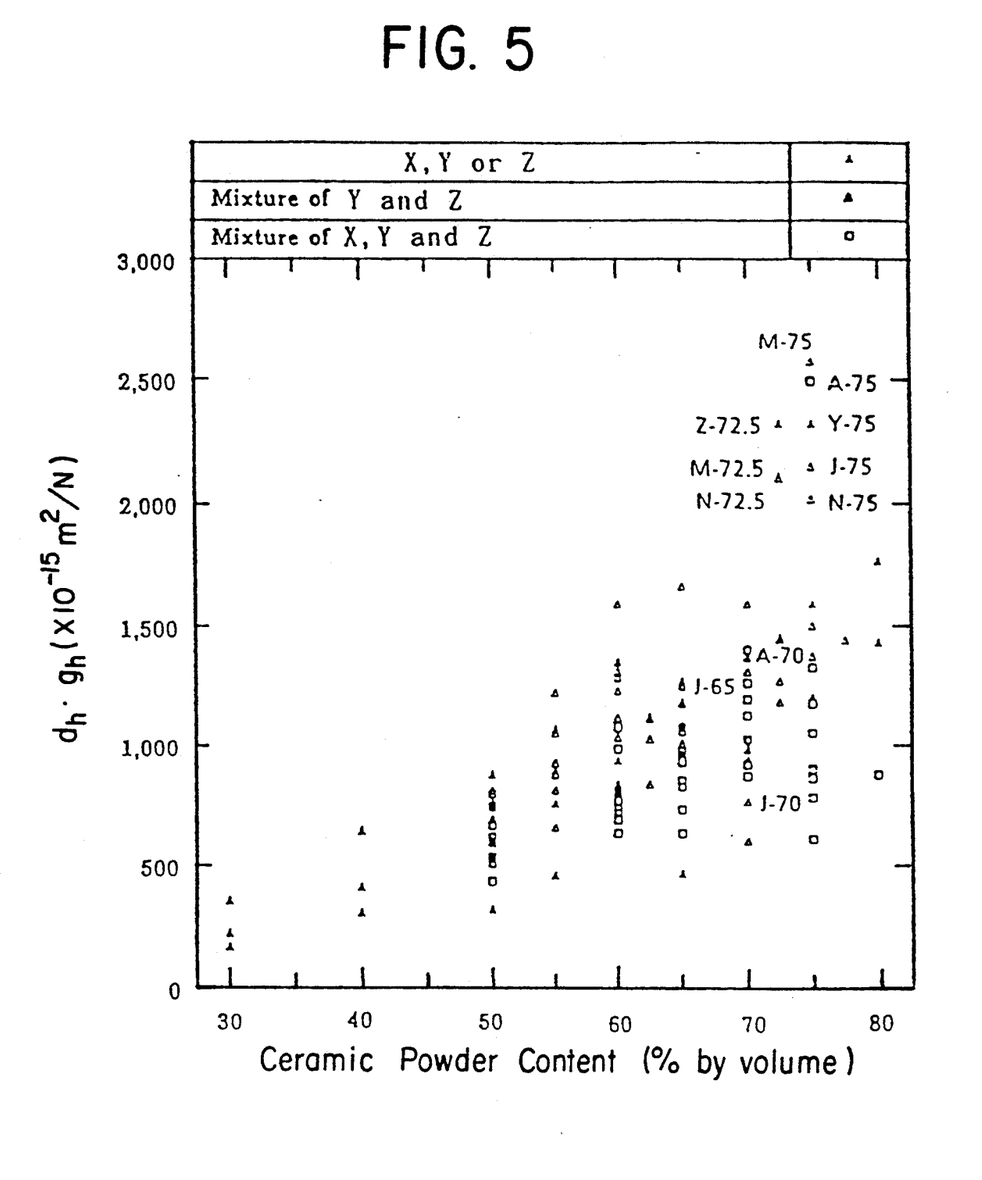
FIG. 5 is a graph showing the relationship between the figure-of-merit $d_h$, $g_h$ and the content of ceramic powder blend of respective piezoelectric composites.

The above piezoelectric composites were also tested for their figure-of-merits $d_h \cdot g_h$ at hydrostatic pressure of 15 MPa. The results are shown in FIG. 5. The composite A-75 has a figure-of-merit $d_h \cdot g_h$ of $2,500 \times 10^{-15}$ m²/N which is higher than those of other composites containing ceramic powder blends A-I. Among the piezoelectric composites tested, those having a figure-of-merit of greater than $2,000 \times 10^{-15}$ m²/N include Y-75 (containing only the piezoelectric particle Y with an average particle size of 7.3 μm in an amount of 75% by volume), Z-72.5 (containing only the piezoelectric particle Z with an average particle size of 31.8 μm in an amount of 72.5% by volume). J-75, M-75, M-72.5, N-72.5 and A-75. The figure-of-merits of the composites A-70, J-65 and J-70 are as low as about $1,500 \times 10^{-15}$ m²/N though they show relatively high piezoelectric constants $d_h$ of about $35 \times 10^{-12}$ C/N.

From the above results shown in FIGS. 3(a)-3(d), 4 and 5, it is appreciated that the composite A-75 containing 75% by volume of the ceramic powder blend A consisting of equal amount of X, Y and Z is low in pressure dependency of $d_h$ and is high in both $d_h$ and $d_h \cdot g_h$ and, hence, has excellent properties required for utilization as a hydrophone. Such characteristics are considered to result from minimization of interstices or space defined between piezoelectric ceramic particles and of the amount of air trapped in the space.

Similar tests were further conducted by varying the content of the ceramic powder blend A. As a result, significantly desirable properties are obtained when the ceramic powder blend A is used in an amount of between 72 and 78% by volume. The composites A-72 and A-78 have $d_h$ of $37 \times 10^{-12}$ C/N and $38 \times 10^{-12}$ C/N, respectively and show a decrease in $d_h$ of 12% and 10%, respectively.

Thus, the composites containing about 72-78% by volume of ceramic powder blend dispersed in an organic matrix and consisting of nearly equal amount of X, Y and Z have excellent piezoelectric characteristics and are low in pressure dependency so that they are very suited for utilization as piezoelectric elements for hydrophones.

EXAMPLE 2

PZT (lead titanate zirconate, Pb (Ti, Zr)O₃) having an average particle size of 7.5 μm and a particle size distribution as shown in FIG. 1 was prepared in the conventional manner. This PZT was then blended with lead titanate particles PT (Y, average particle size: 7.3 μm) obtained in Example 1 to obtain mixtures Y' with various PZT/PT blending ratios of 0/100 to 100/0. Each of the mixtures Y' was further blended with lead titanate particles X and Z obtained in Example 1 to obtain a ceramic powder blend with a blending weight ratio of X:Y':Z of 1:1:1. Using respective ceramic powder blends, piezoelectric composite rubber sheets having various contents (50–75% by volume) of the powder blends were prepared in the same manner as described in Example 1. Each composite was further processed for reverse poling by impressing a reverse direct current voltage of 0–70 KV/cm. for poling, thereby to obtain a piezoelectric composite rubber sheet.

The thus obtained piezoelectric composites were then tested for their hydrostatic piezoelectric constants $d_h$, $d_{33}$, and $d_{31}$ and dielectric constant $\epsilon^T_{33}/\epsilon_0$ using a wave receiving sensitivity measuring vessel containing Fluorinat. The results are summarized in FIG. 6 by way of graphs (curves 101-104) showing relationship between $d_h$, $d_{33}$, $d_{31}$ and $\epsilon^T_{33}/\epsilon_0$ and the blending ratio PZT/PT of the blend Y' of the piezoelectric ceramic powder blend (X+Y'+Z) contained in respective composites in an amount of 75% by volume.

For the purpose of comparison, lead zirconate titanate PZT having an average particle size of 2.8 μm was blended with the same amount of lead titanate (X, $PbTiO_3$) having an average particle size of 3.3 μm. Using this ceramic powder blend, piezoelectric composite rubber sheets having 50, 60 and 70% by volume of the powder blend were prepared in the same manner as above. The dielectric constant $d_h$ of each of these composites, which contain neither Y' nor Z, is also shown in FIG. 6 as graphs (curves 201-203) showing the relationship between the dielectric constant and the weight ratio of PZT (2.8 μm) to PbTiO₃ (3.3 μm).

Figure 6:
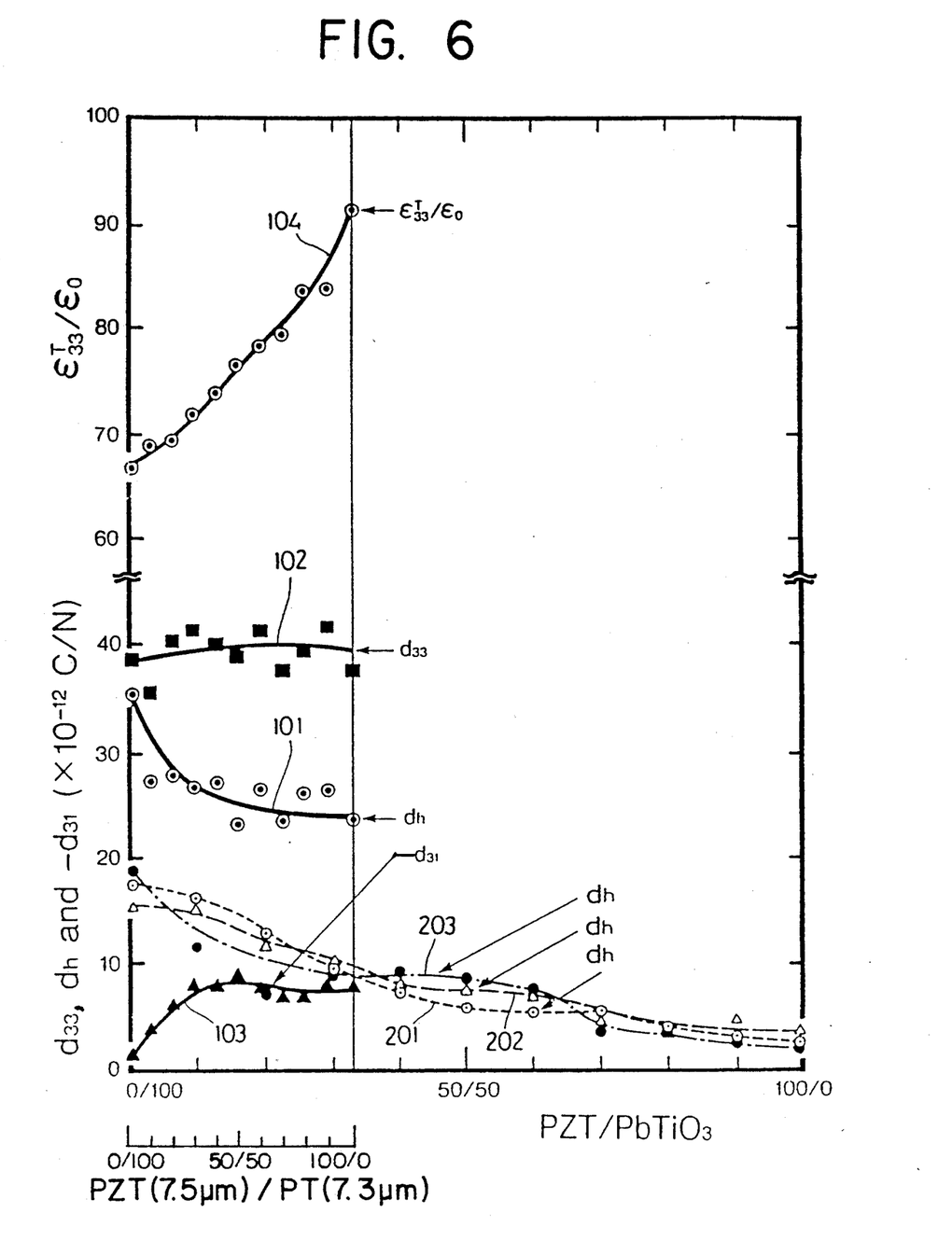
FIG. 6 is a graph showing the relationship between the weight ratio PZT/PT and the piezoelectric constants $d_h$, $d_{33}$ and $d_{31}$ and dielectric constant $\epsilon^T_{33}/\epsilon_0$ of the piezoelectric composites of the present invention and conventional ones.

From the results shown in FIG. 6, it is appreciated that the piezoelectric constant $d_h$ of the composites of the present invention (curve 101) is much greater than the known ones (curves 201-203).

Figure 7:
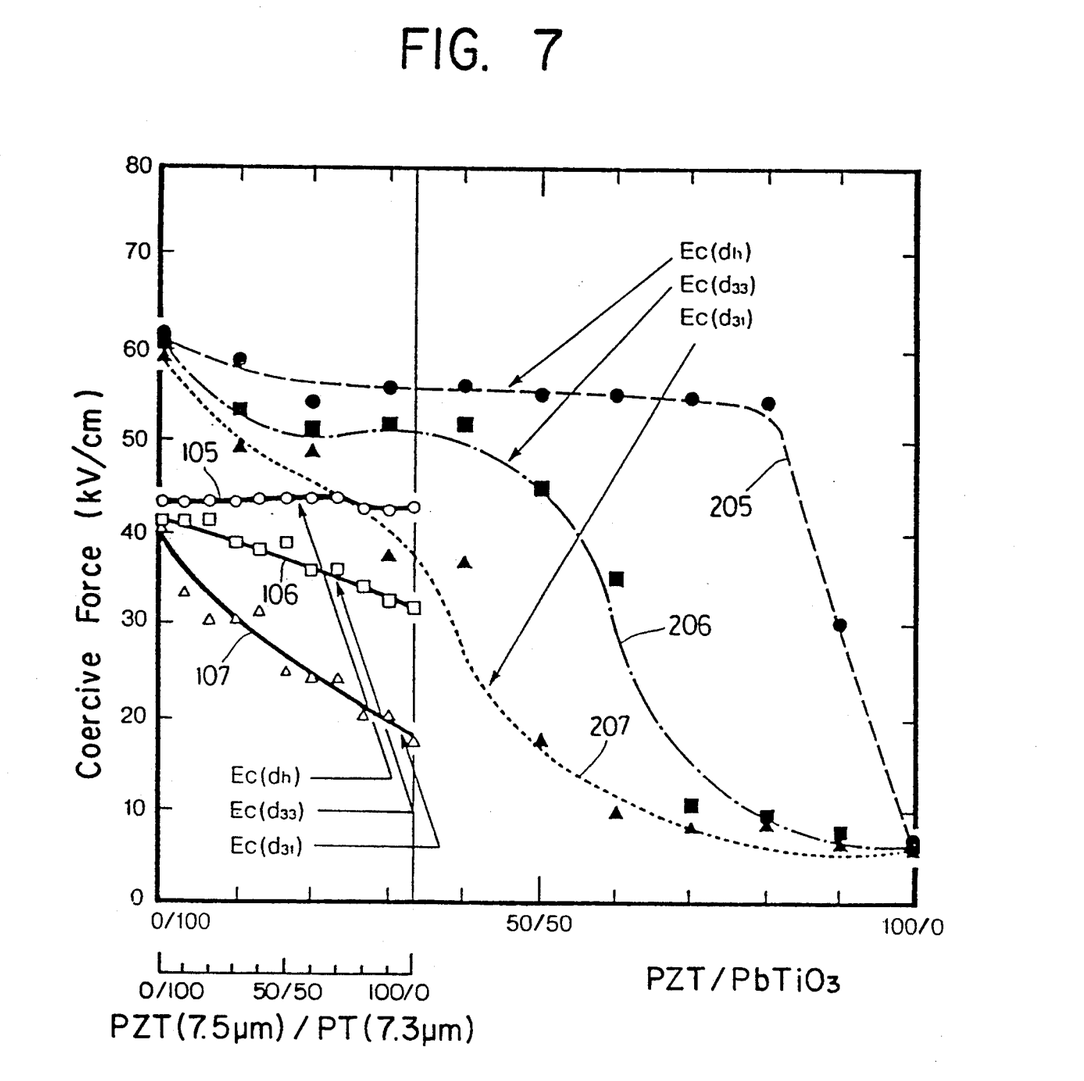
FIG. 7 is a graph showing the relationship between the weight ratio PZT/PT and the coercive force of the piezoelectric composites of the present invention and conventional ones.

FIG. 7 shows the relationship between coercive force and blending ratio PZT/PT. The coercive force is a voltage required for rendering respective piezoelectric constants of the piezoelectric composite zero. The curves 105-107 are for the composites according to the present invention containing 75% by volume of the piezoelectric ceramic powder blend (X+Y'+Z), whereas the curves 205-207 are for the known composites having 50% by volume of the powder blend composed of lead zirconate titanate PZT having an average particle size of 2.8 μm and the same amount of lead titanate (X, PbTiO₃) having an average particle size of 3.3 μm. From the results shown in FIG. 7, it will be seen that the coercive force in connection with $d_{31}$ is reduced with an increase in amount of PZT. It is also noted that the decrease in piezoelectric constants $d_h$ and $d_{33}$ due to an increase in PZT is less apparent than that in $d_{31}$. This suggests that it is possible to make only $d_{31}$ zero by impression of a reverse voltage.

Figure 8:
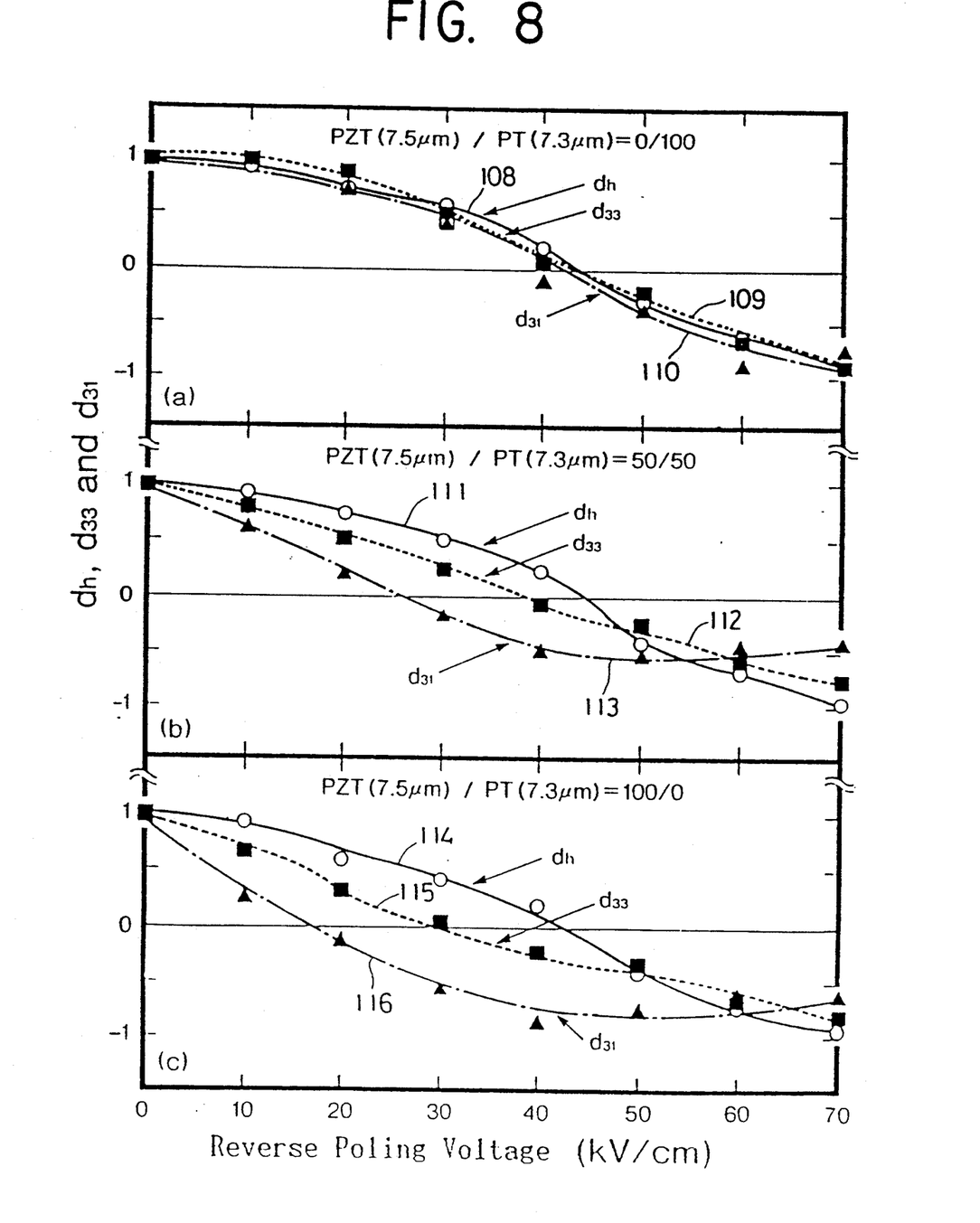
FIG. 8 is a graph showing the relationship between the piezoelectric constants $d_h$, $d_{33}$ and $d_{31}$ and the reverse poling voltage of respective piezoelectric composites.

FIG. 8 illustrates the relationship between the reverse poling voltage and respective piezoelectric constants $d_h$, $d_{33}$ and $d_{31}$ in various PZT/PT ratios of 0/100, 50/50 and 100/0 of the composites containing 75% by volume of the piezoelectric ceramic powder blend (X+Y'+Z) having X:Y':Z of 1:1:1. From the results shown in FIG. 8, it will be seen that by application of about 43 kV/cm of a direct voltage to the composite with a PZT/PT ratio of 0/100, the piezoelectric constants $d_h$, $d_{33}$ and $d_{31}$ become zero (namely, the composite does not exhibit piezoelectric characteristics) due to dispolarization.

In the case of the composite with a PZT/PT ratio of 50/50, the reverse poling at about 25 kV/cm causes the dielectric constant $d_{31}$ to be reduced to almost zero with the other constants $d_{33}$ and $d_h$ being maintained at plus values. Accordingly, by application of such a reverse poling field, it is possible to render the composite sensitive to positive signals caused by the strain in the direction of $d_{33}$ but is insensitive to noise signals caused by the strain in the direction of $d_{31}$, and thereby to improve the S/N ratio thereof. This also applies to the case of the composite with a PZT/PT ratio of 100/0, in which the piezoelectric constant $d_{31}$ is almost zero when applied with a reverse poling voltage of about 17 kV.

The above effect attained by the reverse poling is attributed to the presence of PZT which has low coercive force and is thus easily polarizable. Namely, by application of a reverse poling voltage to a composite material containing both PZT and PT dispersed in an organic matrix, the polarization directions of PZT and PT become opposite to each other. Since the piezoelectric constants $d_h$ and $d_{33}$ of PT are greater than those of PZT and since the piezoelectric constant $d_{31}$ of PT is similar to that of PZT, $d_{31}$ of the composite can be zero with $d_{33}$ and $d_h$ thereof remaining positive.

Figure 9:
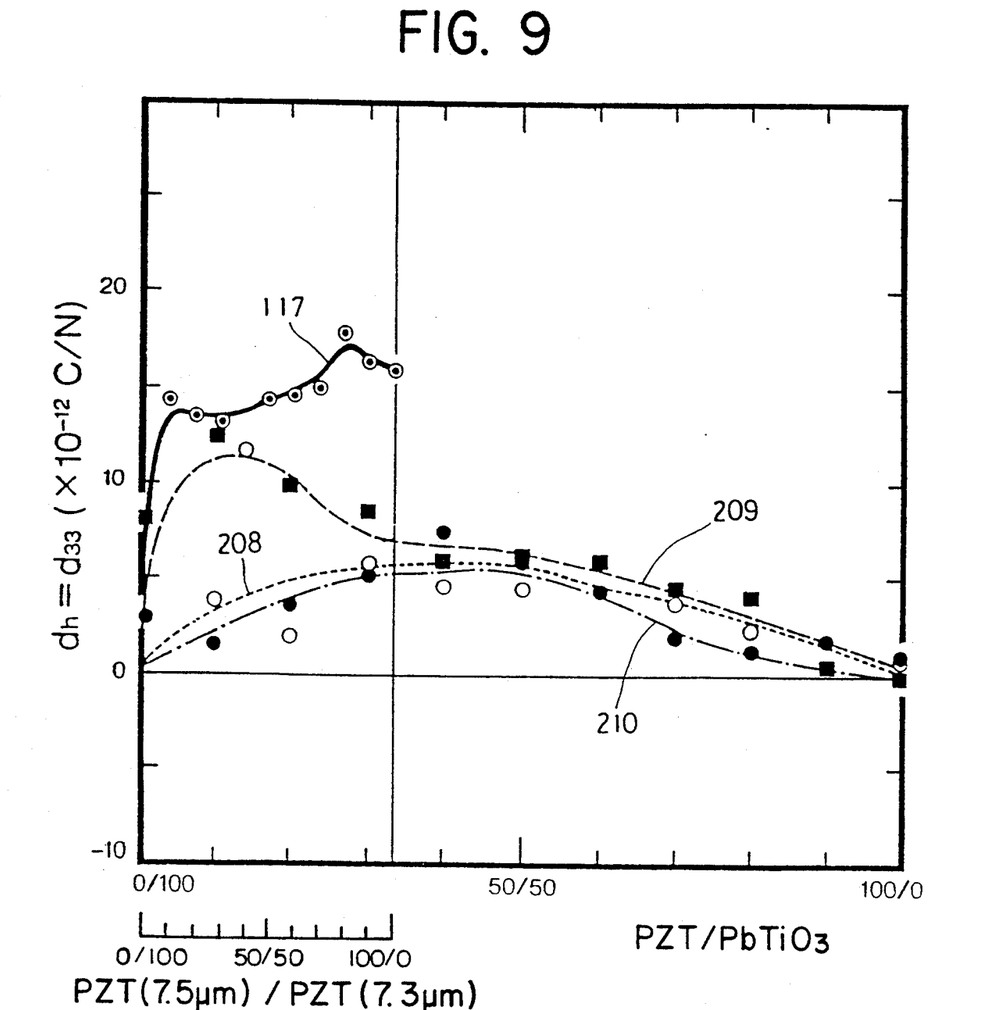
FIG. 9 is a graph showing the relationship between the weight ratio PZT/PT and the piezoelectric constant $d_h$ of respective piezoelectric composites subjected to reverse poling to make $d_{31}$ zero.

Additionally, the composite material according to the present invention containing the piezoelectric ceramic powder blend (X+Y'+Z) and having been subjected to reverse poling for rendering $d_{31}$ substantially zero shows a high $d_h$ in comparison with the composite material containing a ceramic powder blend consisting of a single kind of PZT and a single kind of PT. This is appreciated from the results shown in FIG. 9, in which curve 117 shows the relationship between $d_h$ and the blending ratio PZT/PT of the blend Y' of the piezoelectric ceramic powder blend (X+Y'+Z) contained in respective composites in an amount of 75% by volume, while curves 208-210 show the relationship between $d_h$ and the weight ratio of PZT (2.8 μm) to PbTiO₃ (3.3 μm) of a ceramic powder blend contained in respective piezoelectric sheets (the same samples as those used in the test described previously with reference to FIG. 6) in amounts of 50, 60 and 70% by volume. From the results shown in FIG. 9, the composite materials of the present invention show improved $d_h$ and the improvement is significant ($d_h$ is about $18 \times 10^{-12}$ C/N) when PZT/PT is about 80/20.

Similar tests were further conducted by varying the content of the ceramic powder blend (X+Y'+Z). As a result, significantly desirable properties are obtained when the ceramic powder blend is used in an amount of between 72 and 78% by volume. The composites containing the ceramic blend (X+Y'+Z) in 72 and 78% by volume and each having a PZT/PT ratio of 80/20 show $d_h$ of $16 \times 10^{-12}$ C/N and $17 \times 10^{-12}$ C/N, respectively, when subjected to reverse poling for making $d_{31}$ zero. With a content of the ceramic blend in excess of 78% by volume causes reduction in flexibility of the composite material. Thus, the composites which contain about 72-78% by volume of ceramic powder blend dispersed in an organic matrix and consisting of nearly equal amount of X, Y' and Z and which have been subjected to reverse poling treatment so as to reduce the piezoelectric constant $d_{31}$ to substantially zero show a significantly improved Signal-to-Noise ratio a high $d_h$ so that they are very suited for utilization as piezoelectric elements for hydrophones.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A piezoelectric composite material comprising an organic matrix, and a piezoelectric ceramic powder dispersed in said matrix and consisting of 25-41.6% by weight of a first group of lead titanate particles having a first average particle size, 25-41% by weight of a second group of lead titanate particles having a second average particle size and 25-41.6% by weight of a third group of lead titanate particles having a third average particle size, said first, second and third average particle sizes being different from each other and said piezoelectric ceramic powder being present in an amount of 72-78% based on the total volume of said piezoelectric ceramic powder and said organic matrix.

2. A piezoelectric composite material as claimed in claim 1, wherein said first, second and third average particle sizes are 2.5-4.5 μm, 5-10 μm and 20-40 μm, respectively.

3. A piezoelectric composite material as claimed in claim 1, wherein said first, second and third groups are present in substantially the same amount.

4. A piezoelectric composite material as claimed in claim 1, wherein said piezoelectric ceramic powder is present in an amount of 74-76% based on the total volume of said piezoelectric ceramic powder and said organic matrix.

5. A piezoelectric composite material comprising an organic matrix, and a piezoelectric ceramic powder dispersed in said matrix and consisting of 25–41.6% by weight of a first group of particles of lead titanate having a first average particle size, 25–41.6% by weight of a second group of particles of lead titanate zirconate or a mixture of lead titanate zirconate with lead titanate having a second average particle size and 25–41.6% by weight of a third group of particles of lead titanate having a third average particle size, said first, second and third average particle sizes being different from each other and said piezoelectric ceramic powder being present in an amount of 72–78% based on the total volume of said piezoelectric ceramic powder and said organic matrix, said composite material having been prepoled by application of a high voltage and thereafter subjected to reverse poling so that $d_{31}$ thereof is substantially zero.

6. A piezoelectric composite material as claimed in claim 5, wherein said first, second and third average particle sizes are 2.5–4.5 μm, 5–10 μm and 20–40 μm, respectively.

* * * * *